US009148111B2

(12) United States Patent
Rogers

(10) Patent No.: US 9,148,111 B2
(45) Date of Patent: Sep. 29, 2015

(54) PHASE SHIFTERS AND TUNING ELEMENTS

(71) Applicant: HARRIS CORPORATION, Melbourne, FL (US)

(72) Inventor: John E. Rogers, Vero Beach, FL (US)

(73) Assignee: Harris Corporation, Malbourne, FL (US)

( * ) Notice: Subject to any disclaimer, the term of this patent is extended or adjusted under 35 U.S.C. 154(b) by 435 days.

(21) Appl. No.: 13/689,925

(22) Filed: Nov. 30, 2012

(65) Prior Publication Data

US 2014/0152400 A1 Jun. 5, 2014

(51) Int. Cl.
*H03H 7/20* (2006.01)
*H01P 1/18* (2006.01)
*H01G 5/16* (2006.01)
*H03H 7/18* (2006.01)
*H03H 7/00* (2006.01)

(52) U.S. Cl.
CPC . *H03H 7/20* (2013.01); *H01G 5/16* (2013.01); *H01P 1/18* (2013.01); *H03H 7/185* (2013.01); *H03H 2007/006* (2013.01)

(58) Field of Classification Search
CPC .. H01P 1/18; H01P 1/182–1/184; H01P 9/00; H03H 7/18; H03H 7/185; H03H 7/20; H03H 2007/006; H01G 5/16

USPC .......................... 333/156, 159, 160, 204, 232
See application file for complete search history.

(56) References Cited

U.S. PATENT DOCUMENTS

| 4,616,196 | A | * | 10/1986 | Sharma ........................ 333/161 |
| 7,012,489 | B2 | | 3/2006 | Sherrer et al. |
| 7,786,820 | B2 | * | 8/2010 | Hunt et al. .................. 333/24 C |
| 7,898,356 | B2 | | 3/2011 | Sherrer et al. |

OTHER PUBLICATIONS

Sundaram, A., et al., "MEMS-Based Electronically Steerable Antenna Array Fabricated Using PCB Technology", Journal of Microelectromechanical Systems, vol. 17, No. 2, Apr. 2008, pp. 356-262.

* cited by examiner

*Primary Examiner* — Robert Pascal
*Assistant Examiner* — Albens Dieujuste
(74) *Attorney, Agent, or Firm* — Robert J. Sacco, Esq.; Fox Rothschild LLP

(57) ABSTRACT

Embodiments of phase shifters (10) include electrical conductors (34) suspended within an electrically-conductive housing (28), and a shuttle (16) having an electrically-conductive plate (74) that provides a variable capacitance between a ground potential and the electrical conductor (34) when the shuttle (16) is moved between a first and second position. The plate (74) is electrically connected to a ground plane (27) of the phase shifter (10) by adjacent electrically-conductive portions (54, 55b, 53a) of the shuttle (16).

26 Claims, 11 Drawing Sheets

PHASE SHIFTERS AND TUNING ELEMENTS

BACKGROUND OF THE INVENTION

1. Statement of the Technical Field

The inventive arrangements relate to phase shifters, and more particularly to phase shifters which are broad-band, low-loss radio frequency (RF) microelectromechanical systems (MEMS) devices.

2. Description of Related Art

Communication systems, such as broadband satellite communication systems, commonly operate anywhere from 300 MHz (UHF band) to 300 GHz (mm-wave band). Such examples include TV broadcasting (UHF band), land mobile (UHF band), global positioning systems (GPS) (UHF band), meteorological (C band), and satellite TV (SHF band). Most of these bands are open to mobile and fixed satellite communications. Higher frequency bands typically come with larger bandwidths, which yield higher data rate operation. Phase shifters used in these types of systems need to operate with relatively low losses, e.g., less than one decibel (dB) of insertion loss, at such frequencies.

Miniaturized phase shifters fabricated as monolithic microwave integrated circuit (MMIC) phase shifters are commonly used in broadband communications systems due to stringent constraints imposed on the components of such systems, particularly in satellite-based applications. Currently, available MMIC digital phase shifters operate with relatively high insertion loss (i.e., 7 dB of insertion loss at 18.5 GHz).

SUMMARY OF THE INVENTION

The invention concerns a phase shifter. The phase shifter includes a housing and an electrical conductor suspended within the housing on electrically-insulative supports. The housing and the electrical conductor form a transmission line. A shuttle is provided which includes a bridge section, a plate attached to said bridge section, and an actuator section. The bridge section, the plate and the actuator are formed of electrically conductive material. An insulator portion formed of electrically insulative material electrically isolates at least said plate from said actuator section. The shuttle is configured for movement between a first position and a second position. In the first position, the plate is spaced a first distance apart from the electrical conductor. In the second position the plate is spaced a second distance apart from the electrical conductor. The plate and said electrical conductor in combination form a capacitor having a capacitance value. This capacitance value will vary depending upon whether said plate is spaced at said first distance as compared to said second distance. The capacitor plate and the housing are coupled to a common ground so that the capacitance between the electrical conductor and ground is varied in accordance with the spacing of the plate from the electrical conductor. This variance in capacitance advantageously changes a phase length of the transmission line.

BRIEF DESCRIPTION OF THE DRAWINGS

Embodiments will be described with reference to the following drawing figures, in which like numerals represent like items throughout the figures and in which.

DETAILED DESCRIPTION

The invention is described with reference to the attached figures. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operation are not shown in detail to avoid obscuring the invention. The invention is not limited by the illustrated ordering of acts or events, as some acts may occur in different orders and/or concurrently with other acts or events. Furthermore, not all illustrated acts or events are required to implement a methodology in accordance with the invention.

The invention concerns a phase shifter constructed on a substrate. The phase shifter includes a ground plane and a coaxial transmission line section including an exterior housing coupled to the ground plane. An electrical conductor is suspended within the housing by a plurality of tabs spaced at a plurality of locations along a length of the transmission line. A shuttle is suspended on first and second mounts secured to the substrate. A capacitor plate is mechanically coupled to the shuttle and electrically connected to the ground plane. The shuttle is arranged to transition the capacitor plate from a first position located a first distance from the electrical conductor, to a second position located a second distance from the conductor responsive to an electrical input signal. The shuttle advantageously includes at least one resilient member configured to return the shuttle to the first position in the absence of the electrical signal. The shuttle, the housing, the plate and the electrical conductor are comprised of a plurality of layers of electrically conductive material disposed on the substrate.

The figures depict a MEMS phase shifter 10. The phase shifter 10 can selectively vary a capacitance as between a center conductor of a coaxial transmission line section. By varying the capacitance, a phase length of the transmission line section can be effectively varied. The phase shifter 10 has a maximum height ("z" dimension) of approximately 1 mm; a maximum width ("y" dimension) of approximately 3 mm; and a maximum length ("x" dimension) of approximately 3 mm. The phase shifter 10 is described as a MEMS phase shifter having these particular dimensions for exemplary purposes only. Alternative embodiments of the phase shifter 10 can be scaled up or down in accordance with the requirements of a particular application, including size, weight, and power (SWaP) requirements.

Figure 1:
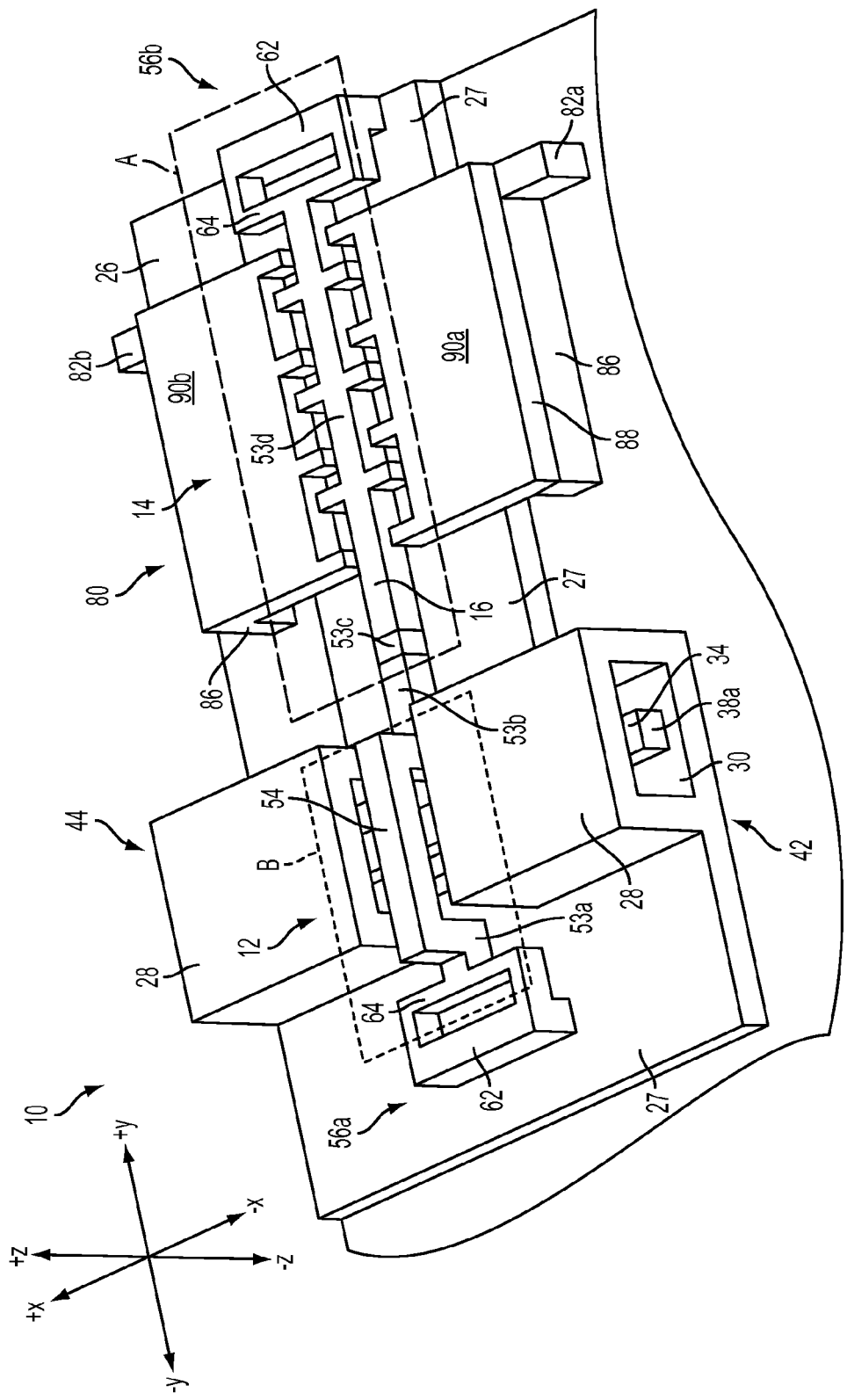
FIG. 1 is a top perspective view of a MEMS phase shifter.

The phase shifter 10 comprises a variable capacitor portion 12, an actuator portion 14, and a shuttle 16, as shown in FIG. 1. As discussed below, the shuttle 16 moves in the "y" direction between a first and a second position, in response to energization and de-energization of the actuator portion 14. The shuttle 16 facilitates movement of a capacitor plate associated with variable capacitor portion 12 when the shuttle 16 moves, thereby changing a capacitance between a center conductor of the transmission line section and a ground plane. The change of capacitance causes the phase length of the transmission line section to vary in accordance with a position of the shuttle.

Figure 4:
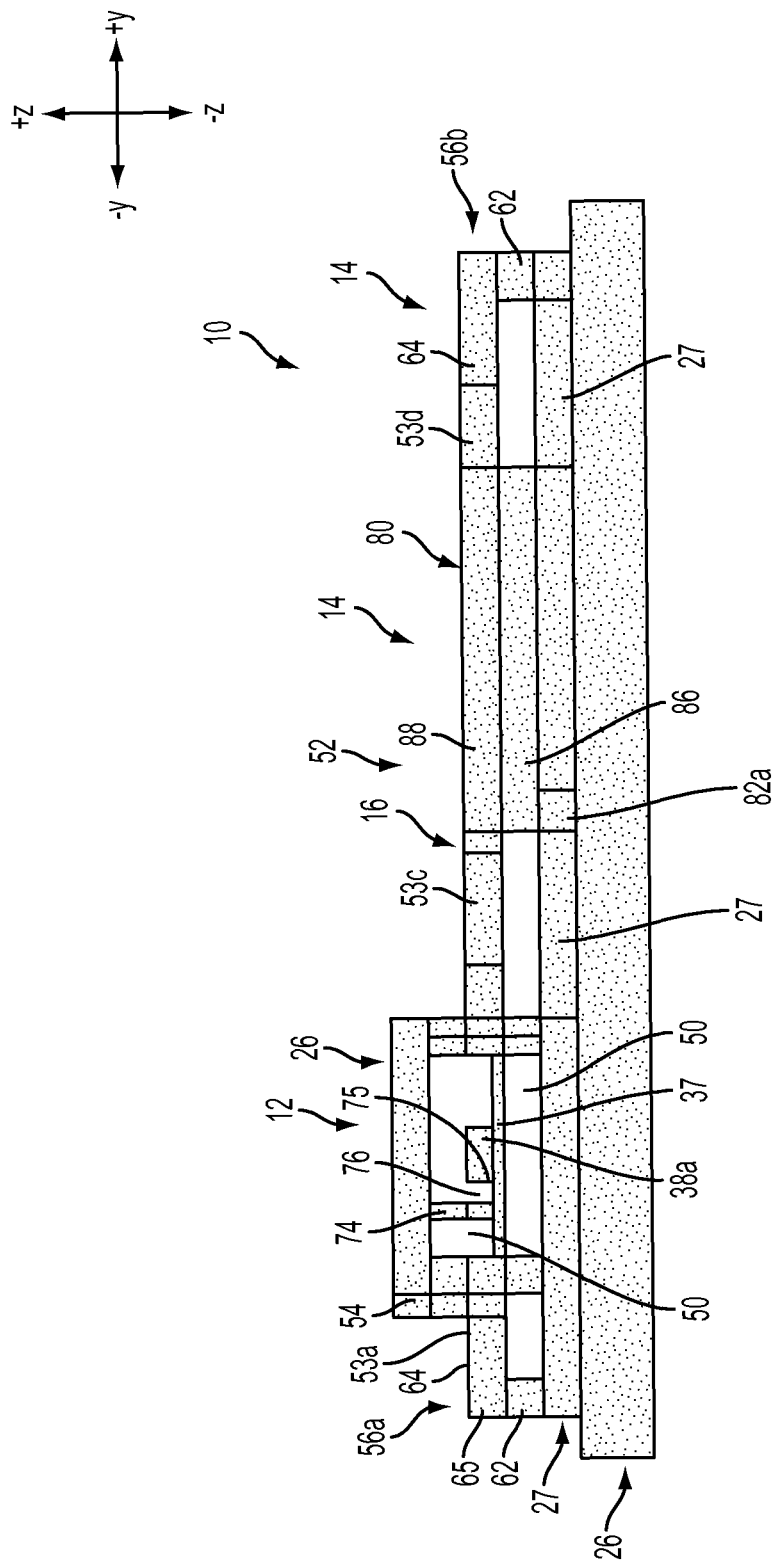
FIG. 4 is a front view of the phase shifter shown FIGS. 1-3, depicting the shuttle in the first position and showing the layered structure of the phase shifter, and with relief added to better denote the illustrated structure.

The phase shifter 10 comprises a substrate 26 formed from a dielectric material such as silicon (Si), as shown in FIGS. 1 and 4. The substrate 26 can be formed from other materials, such as glass, silicon-germanium (SiGe), or gallium arsenide (GaAs) in alternative embodiments. The phase shifter 10 also includes a ground plane 27 disposed on the substrate 26. The phase shifter 10 is formed from five layers of an electrically-conductive material such as copper (Cu). Each layer can have a thickness of, for example, approximately 50 μm. The ground plane 27 is part of a first or lowermost layer of the electrically-conductive material. The number of layers of the electrically-conductive material is application-dependent, and can vary with factors such as the complexity of the design, hybrid or monolithic integration of other devices with the phase shifter 10, the overall height ("z" dimension) of the phase shifter 10, the thickness of each layer, and so on.

The variable capacitor portion 12 of the phase shifter 10 includes an electrically-conductive ground housing 28 disposed on the ground plane 27, as illustrated in FIGS. 1 and 4. The ground housing 28 is formed from portions of the second through fifth layers of the electrically-conductive material. The ground housing 28 and the underlying portion of the ground plane 27 define an internal channel 30 that extends substantially in the "x" direction, as depicted in FIGS. 1-4, and 6.

The variable capacitor portion 12 further includes an electrically-conductive inner conductor 34 having a substantially rectangular cross section, as shown in FIGS. 1-4, and 6. The inner conductor 34 can be formed as part of the third layer of the electrically-conductive material.

The inner conductor 34 is positioned within the channel 30, as shown in FIGS. 1-4, and 6. A first end 38a of the inner conductor 34 is positioned at a first end of the channel 30. A second end 38b of the inner conductor 34 is positioned at a second end of the channel 30.

The inner conductor 34 and the surrounding portion of the ground housing 28 define an input port 42 and an output port 44 of the variable capacitor portion 12. A first electronic device can be electrically connected to the input port 42 and a second electronic device can be electrically connected to the output port 44. The first and second electronic devices can be integrated with the respective input and output ports 42, 44.

Figure 2:
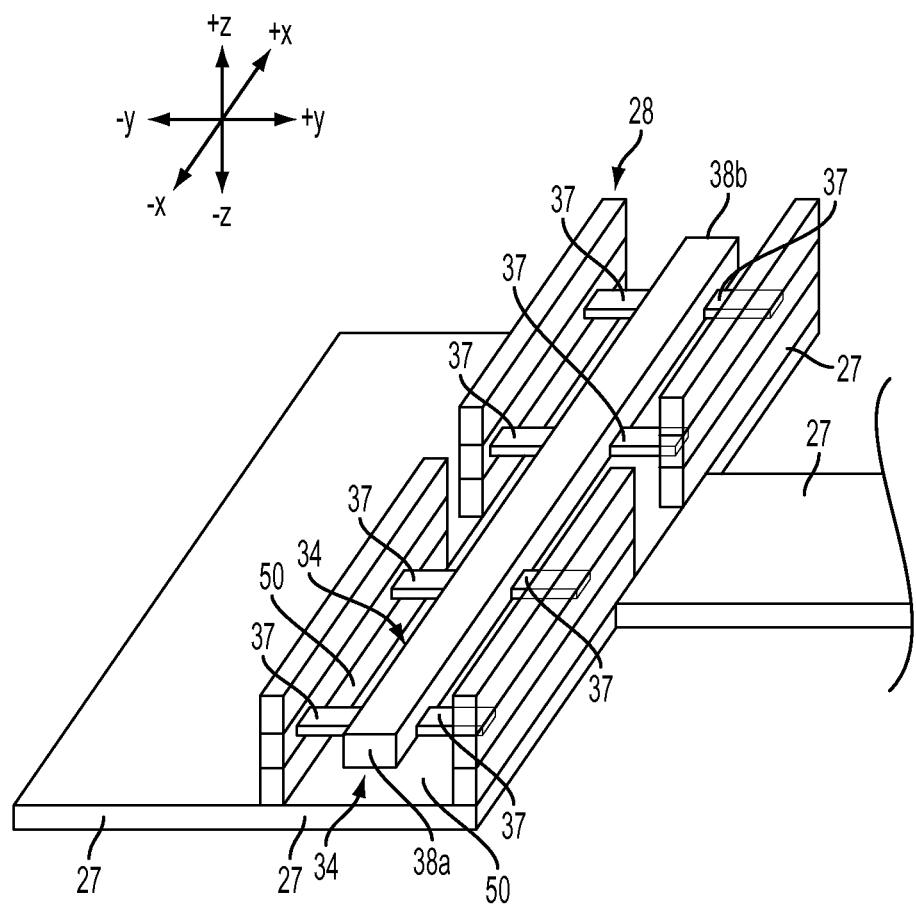
FIG. 2 is a top perspective view of a ground housing, and a portion of a ground plane of the phase shifter shown in FIG. 1, with a top layer of the housing removed for clarity of illustration.

The inner conductor 34 is suspended within the channel 30 on electrically-insulative tabs 37, as illustrated in FIG. 2. The tabs 37 are formed from a dielectric material. For example, the tabs 37 can be formed from polyethylene, polyester, polycarbonate, cellulose acetate, polypropylene, polyvinyl chloride, polyvinylidene chloride, polystyrene, polyamide, polyimide, benzocyclobutene, SU8, etc., provided the material will not be attacked by the solvent used to dissolve the sacrificial resist during manufacture of the phase shifter 10 as discussed below. The tabs 37 can each have a thickness of, for example, approximately 15 μm. Each tab 37 spans the width, i.e., y-direction dimension, of the channel 30. The ends of each tab 37 are sandwiched between the portions of the second and third layers of electrically-conductive material that form the sides of the ground housing 28. The inner conductor 34 is surrounded by, and spaced apart from the interior surfaces of the ground housing 28 by an air gap 50. The air gap 50 acts as a dielectric that electrically isolates the inner conductor 34 from the ground housing 28. The type of transmission-line configuration described herein is commonly referred to as a "recta-coax" configuration, otherwise known as micro-coax.

The shuttle 16 has an elongated body 52 that extends substantially in the "y" direction, as shown in FIGS. 1 and 3-6. The body 52 includes an electrically-conductive first portion 53a, and an electrically-conductive second portion 53b. The body 52 also includes an electrically-insulative third portion 53c that adjoins the second portion 53b, and an electrically-conductive actuator section 53d that adjoins the third portion 53c. The electrically-conductive first, second portions 53a, 53b and actuator section 53d are formed as part of the third layer of the electrically-conductive material. The electrically-insulative third portion 53c is formed from a dielectric material such as polyethylene, polyester, polycarbonate, cellulose acetate, polypropylene, polyvinyl chloride, polyvinylidene chloride, polystyrene, polyamide, polyimide, benzocyclobutene, SU8, etc., provided the material will not be attacked by the solvent used to dissolve the sacrificial resist during manufacture of the phase shifter 10 as discussed below. The body 52 also includes a bridge section comprised of electrically conductive bridge portion 54, and bridge risers 55a, 55b. Bridge portion 54 can be formed of the fifth layer of electrically conductive material. Bridge risers 55a, 55b can be formed of the fourth layer of electrically conductive material.

The phase shifter 10 includes a first mount 56a and a substantially identical second mount 56b. The first mount 56a is disposed on the portion of the ground plane 27 associated with the variable capacitor portion 12 of the phase shifter 10, as shown in FIGS. 1, 3, 4 and 6. The second mount 56b is disposed on the portion of the ground plane 27 associated with the actuator portion 14 of the phase shifter 10, as illustrated in FIGS. 1, 4, 5A, and 5B.

The first and second mounts 56a, 56b each include a base 62 that adjoins the ground plane 27, and a beam portion 64 that adjoins the base 62. The beam portion 64 is attached to the base 62 by means of a cantilevered arm 65. Each base 62 is formed as part of the second and third layers of the electrically-conductive material. The beam portions 64 and cantilevered arm are formed as part of the third layer of the electrically-conductive material. It should be noted that the configuration of the beam portions 64 is application-dependent, and can vary with factors such as the amount of space available to accommodate the beam portions 64, the required or desired spring constant of the beam portions 64, etc. Accordingly, the configuration of the beam portions 64 is not limited to that depicted in FIG. 1.

Figure 3:
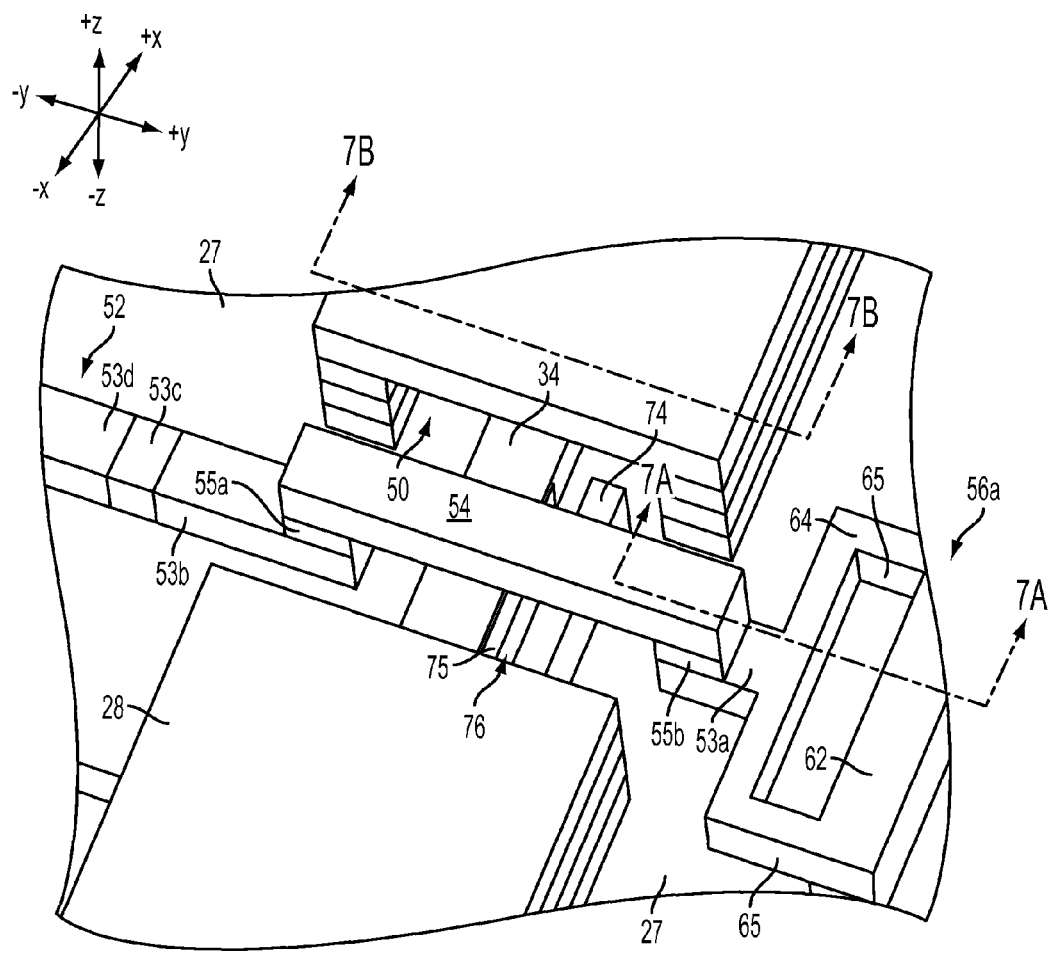
FIG. 3 is a magnified view of the area designated "B" in FIG. 1, showing the shuttle in the first position.
Figure 5A:
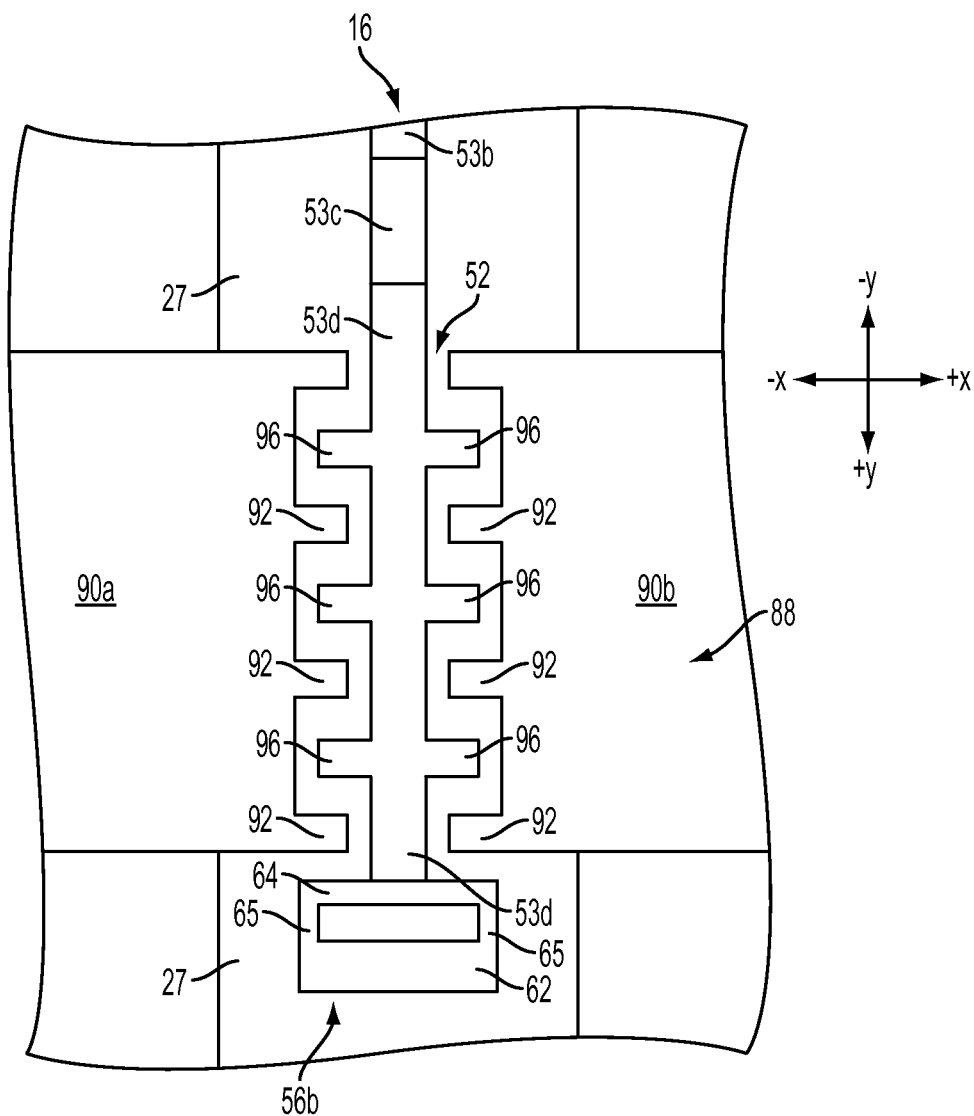
FIG. 5A is a top, magnified view of the area designated "A" in FIG. 1, depicting the shuttle in the first position.
Figure 5B:
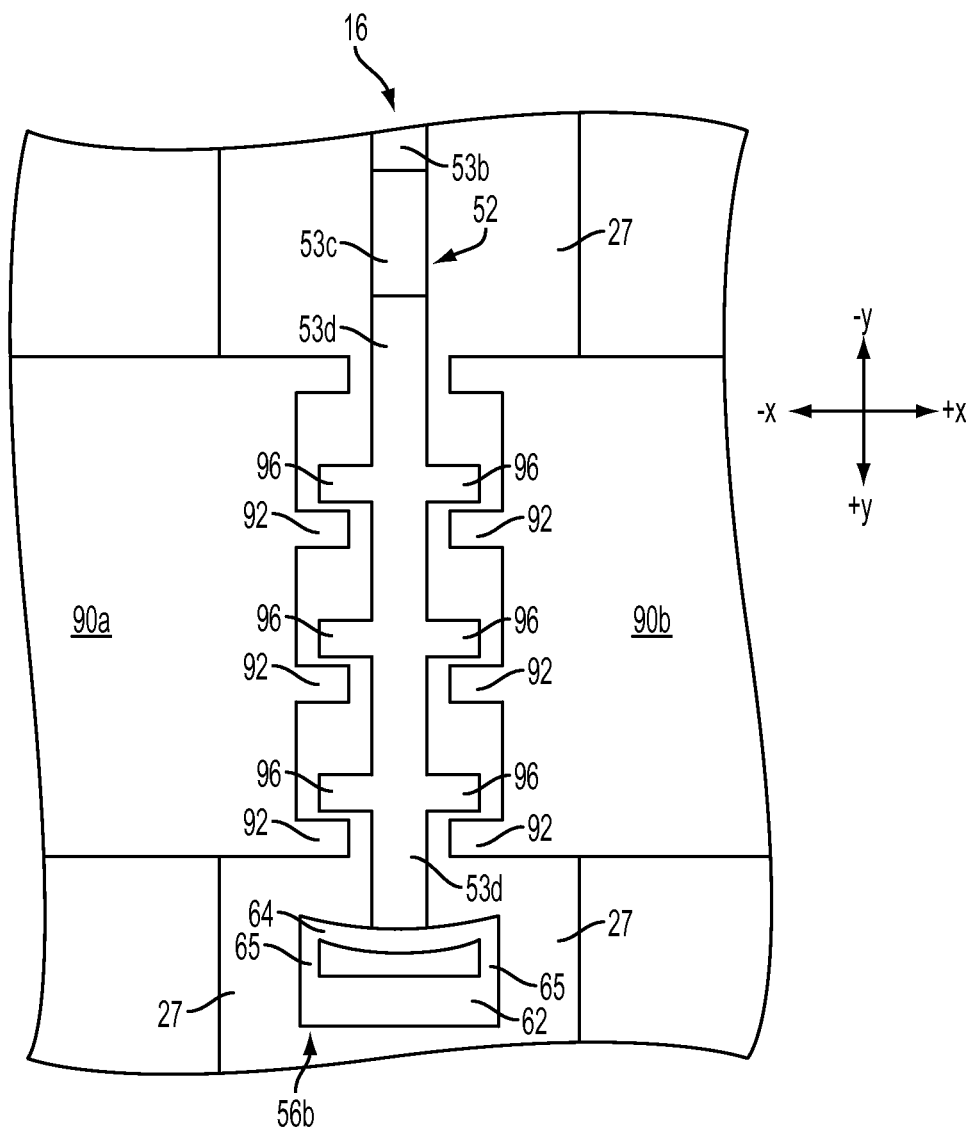
FIG. 5B is a top, magnified view of the area designated "A" in FIG. 1, depicting the shuttle in a second position.
Figure 6:
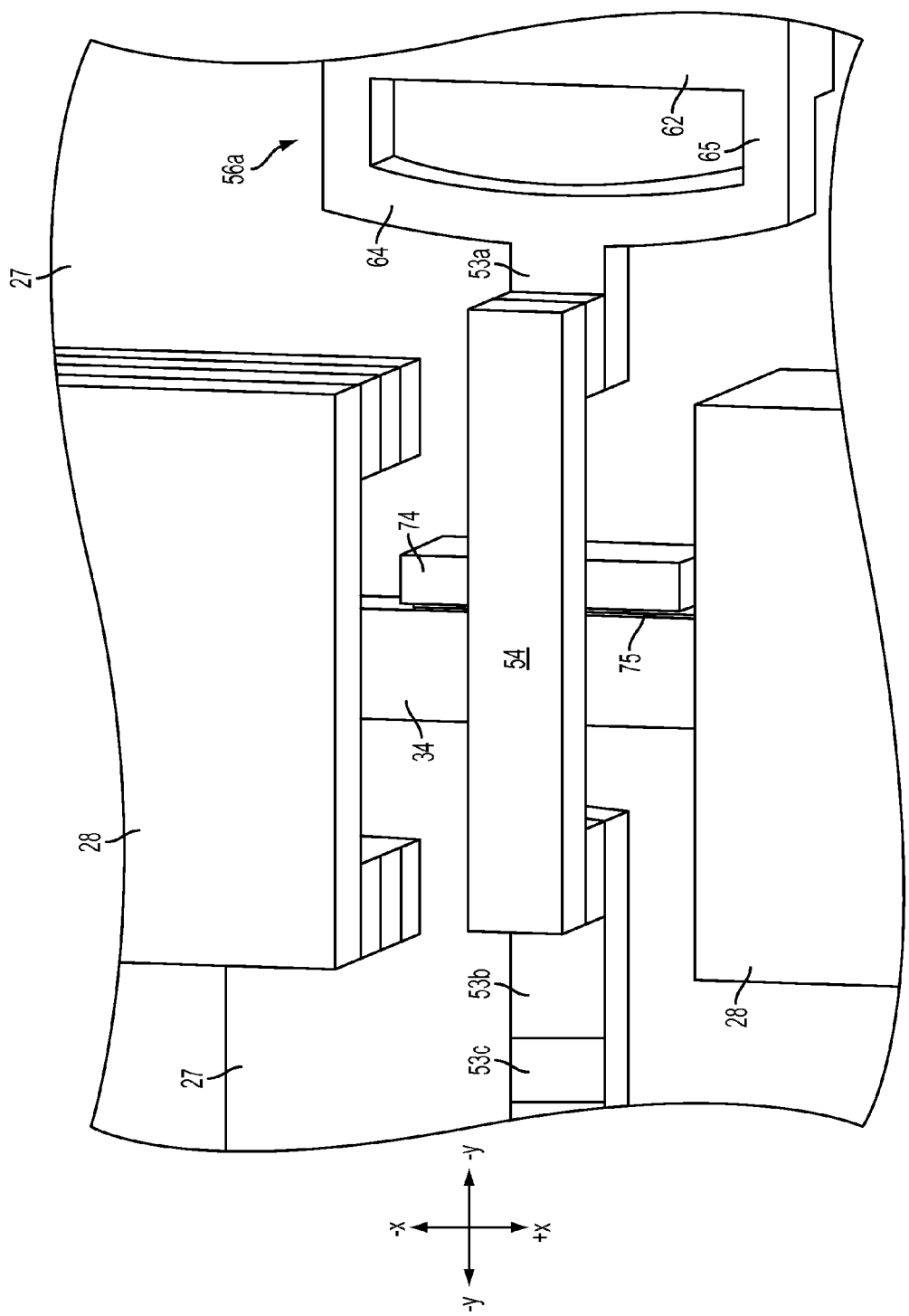
FIG. 6 is a top perspective view of the area designated "B" in FIG. 1, depicting the shuttle in the second position.

An end of the first portion 53a of the shuttle 16 adjoins the beam portion 64 of the first mount 56a, as depicted in FIGS. 1, 3 and 6. An end of the actuator section 53d of the shuttle 16 adjoins the beam portion 64 of the second mount 56b, as illustrated in FIGS. 1, 5A, and 5B. The shuttle 16 is thus suspended from, and fully supported by the first and second mounts 56a, 56b by virtue of the mechanical connection between the first portion 53a of the shuttle 16 and the beam portion 64 of the first mount 56a; and the mechanical connection between the actuator section 53d of the shuttle 16 and the beam portion 64 of the second mount 56b.

The beam portions 64 are configured to deflect so as to facilitate movement of the shuttle 16 in its lengthwise direction, i.e., in the "y" direction. In particular, the shuttle 16 is in its first position when the beam portions 64 are in their neutral, or un-deflected positions, as depicted in FIGS. 1, 3 and 5A. The beam portions 64 deflect when the shuttle 16 is urged in the "+y" direction, toward its second position, due to electrostatic forces developed in the actuator portion 14 as discussed below. The beam portions 64 are shown in their deflected state in FIGS. 5B and 6.

The bridge portion 54 of the shuttle 16 includes a projection in the form of an electrically conductive plate 74, as shown in FIGS. 3, 4, and 6. The plate 74 extends from the bridge portion 54, into the channel 30, such that a face of the plate 74 is adjacent to a side of the inner conductor 34. The plate also extends in a direction substantially perpendicular to the lengthwise direction of the body 52, e.g., in the "+/−x" directions. The shuttle 16 is configured so that a face of plate 74 is spaced apart from the inner conductor 34 by an air gap 76 when the shuttle 16 is in its first position. The air gap 76 acts as a dielectric insulator that electrically isolates the plate 74 from the inner conductor 34 when the shuttle 16 is in its first position. The plate 74 is electrically connected to ground plane 27 through the electrically conductive bridge portion 54, bridge riser 55b, first portion 53a, beam 64 and base 62. Since the ground plane 27 forms the bottom surface of the housing 28, it will be understood that the ground plane 27 is electrically connected to the housing 28. A dielectric insulator 75 is disposed on a side wall of the inner conductor.

There will be some definite amount of capacitance that is established between the electrical conductor 34 and ground potential (ground plane 27 and/or housing 28) due to the arrangement of the plate 74, the electrical conductor 34 and the dielectric disposed between them. Movement of the shuttle 16 to its second position causes plate 74 to move closer to the electrical conductor 34. In some embodiments of the invention, the movement of the shuttle can cause the plate 74 to close the associated air gap 76 such that the plate is only separated from the electrical conductor 34 by the thickness of the dielectric insulator 75. Still, the invention is not limited in this regard. As the shuttle moves closer to the electrical conductor 34, the amount of capacitance created will change due to the changing distance between the plate 74 and the inner conductor. A maximum capacitance will be obtained when the plate 74 rests immediately adjacent to the dielectric insulator 75, separated only by the thickness of dielectric insulator 75. Accordingly, it will be understood that the movement of the plate 74 as described herein will cause a change in capacitance as between the inner conductor and the ground plane.

The second portion 53b of the body 52 is attached to the bridge riser 55a and adjoins the electrically-insulative third portion 53c of the body 52. The third portion 53c electrically isolates the actuator section 53d from the electrically-conductive first mount 56a. The third portion 53c also electrically isolates the bridge portion 54 and plate 74 from the electrically-conductive actuator section 53d. Thus, electrical isolation of the plate 74 is achieved by way of the air gaps 50 between the inner conductor 34 and the adjacent internal surfaces of the ground housing 28; and by way of the third portion 53c of the shuttle 16.

The actuator portion 14 of the phase shifter 10 includes a body 80, a first lead 82a, and a second lead 82b, as shown in FIGS. 1 and 4. The body 80 includes two legs 86, and an adjoining top portion 88. The legs 86 are formed as part of the first and second layers of the electrically-conductive material. The top portion 88 is formed as part of the third layer of the electrically-conductive material. The legs 86 are disposed on the substrate 26, on opposite sides of the ground plane 27 as shown in FIG. 1. The body 80 thus straddles the ground plane 27, and is not in mechanical or electrical contact with the ground plane 27.

The top portion 88 of the body 80 includes a first half 90a and a second half 90b, as depicted in FIGS. 1, 5A, and 5B. The first half 90a is associated with one of the legs 86, and the second half 90b is associated with the other leg 86 as shown in FIG. 1. The first and second halves 90a, 90b are positioned on opposite sides of the actuator section 53d of the shuttle 16.

The first and second halves 90a, 90b each include three projections in the form of fingers 92 that extend substantially in the "x" direction. The optimal number of fingers 92 is application-dependent, and can vary with factors such as the amount of force that is needed to move the shuttle 16 to its second position.

The actuator section 53d of shuttle 16 includes six projections in the form of fingers 96 that extend substantially in the "x" direction as illustrated in FIGS. 1, 5A, and 5B. Three of the fingers 96 are disposed on a first side of the actuator section 53d, and the other three fingers 96 are disposed on the other side of the actuator section 53d. The actuator section 53d and the first and second halves 90a, 90b of the body 80 are configured so that the fingers 92 and the fingers 96 are interleaved or interdigitated, i.e., the fingers 92, 96 are arranged in an alternating fashion along the "y" direction. Moreover, each of the fingers 96 is positioned proximate as depicted in FIG.

5A, and is separated from the associated finger 92 by a gap of, for example, approximately 50 μm when the shuttle 16 is in its first position.

The first and second leads 82a, 82b of the actuating portion 14 are disposed on the substrate 26 as shown in FIG. 1, and are formed as part of the first layer of the electrically conductive material. The first lead 82a adjoins the leg 86 associated with the first half 90a of the top portion 88 of the body 80. The second lead 82b adjoins the leg 86 associated with the second half 90b of the top portion 88 The first and second leads 82a, 82b can be electrically connected to a voltage source, such as a 120-volt direct current (DC) voltage source (not shown). Because the first and second halves 90a, 90b of the top portion 88 are in contact with their associated legs 86, energization of the first and second leads 82a, 82b results in energization of the first and second halves 90a, 90b, including the fingers 92.

Subjecting the first and second leads 82a, 82b to a voltage causes the shuttle 16 to move from its first to its second position, and to remain in the second position, due to the resulting electrostatic attraction between the shuttle 16 and the actuator portion 14, as follows. As discussed above, the first portion 53a of the shuttle 16 adjoins the beam portion 64 of the first mount 56a, and the actuator section 53d of the shuttle 16 adjoins the beam portion 64 of the second mount 56b, so that the shuttle 16 is suspended from the first and second mounts 56a, 56b. The beam portions 64 are in their neutral or un-deflected positions when the shuttle 16 is in its first position, as depicted in FIGS. 1, 3 and 5A. Moreover, the actuator section 53d of the shuttle 16 is electrically connected to the ground plane 27 by way of the second mount 56b, and is electrically isolated from the bridge portion 54 and plate 74 of the shuttle 16 by the third portion 53c of the shuttle 16. The actuator section 53d, including the fingers 96 thereof, thus remains in a grounded, or zero-potential state at all times.

Subjecting the first and second leads 82a, 82b of the actuator portion 14 to a voltage potential results in energization of the fingers 92, as discussed above. The energized fingers 92 act as electrodes, i.e., an electric field is formed around each finger 92 due the voltage potential to which the finger 92 is being subjected. Each of the energized fingers 92 is positioned sufficiently close to its associated finger 96 on the grounded shuttle 16 so as to subject the associated finger 96 to the electrostatic force resulting from the electric field around the finger 92. The electrostatic force attracts the finger 96 to its corresponding finger 92.

The net electrostatic force acting on the six fingers 96 urges the shuttle 16 in the "+y" direction. The beam portions 64 of the first and second mounts 56a, 56b, which were in their neutral or un-deflected state prior to energization of the fingers 92, are configured to deflect in response to this force as shown in FIGS. 5B and 6, thereby permitting the suspended shuttle 16 to move in the "+y" direction to its second position.

The relationship between the amount of deflection and the voltage applied to the actuator portion 14 is dependent upon the stiffness of the beam portions 64, which in turn is dependent upon factors that include the shape, length, and thickness of the beam portions 64, and the properties, e.g., Young's modulus, of the material from which the beam portion 64 are formed. These factors can be tailored to a particular application so as to minimize the required actuation voltage, while providing the beam portion 64 with sufficient strength for the particular application; with sufficient stiffness to tolerate the anticipated levels shock and vibration; and with sufficient resilience to facilitate the return of the shuttle 16 to its first position when the voltage potential to the actuator portion 14 is removed.

The actuator portion 14 can have a configuration other than that described above in alternative embodiments. For example, suitable comb, plate, or other types of electrostatic actuators can be used in the alternative. Moreover, actuators other than electrostatic actuators, such as thermal, magnetic, and piezoelectric actuators, can also be used in the alternative.

As discussed above, electrical isolation of the signal path through the phase shifter 10 is achieved by way of the air gaps 50 between the inner conductor 34 and the adjacent internal surfaces of the ground housing 28; and by way of the dielectric insulator 75 formed on the inner conductor. The electrical isolation is believed to result in very favorable signal-transmission characteristics for the phase shifter 10. The maximum amount of phase shift achieved by the phase shifter 10 will generally depend upon the maximum variance in the amount of capacitance that can be caused by movement of plate 74. The maximum capacitance will in turn depend on several design factors, such as the permittivity dielectric material 75, the thickness of such dielectric material between the plate and the inner conductor, and the surface area of the plate 74. Since the dimensions of the inner conductor 34 will generally be constrained by a particular design scenario, increases in the surface area of the plate 74 are most easily achieved by increasing its length in a direction aligned with the length of the inner conductor 34 (i.e., in the +/−x direction).

Moreover, because the phase shifter 10 incorporates a relatively large amount of copper in comparison to other types of MEMS phase shifters, which typically are based on thin-film technologies, the phase shifter 10 is believed to have substantially higher power-handling capability and linearity as compared to other types of phase shifters of comparable size. Also, the configuration of the phase shifter 10 makes it capable of being monolithically integrated into systems through the routing of micro-coax lines. Moreover, the phase shifter 10 can be fabricated or transferred onto a suite of various exotic substrates.

The phase shifter 10 is formed in accordance with the following process, which is depicted in FIGS. 7-17. The figures provide a cross-sectional view of a concurrent buildup of two different portions of the phase shifter. On the left side in FIGS. 7-17, there is shown a build up of portions of the shuttle including mount 56a and the bridge section taken along line 7a-7a in FIG. 3. On the right side of the split view there is shown the concurrent build up of a portion of the transmission line formed by ground housing 28 and inner conductor 34, taken along line 7b-7b in FIG. 3.

The phase shifter 10 is formed on the substrate 26. The first layer of the electrically conductive material forms the ground plane 27; a portion of each leg 86 of the body 80 of the actuator portion 14; and a portion of each lead 82a, 82b of the actuator portion 14. A first photoresist layer (not shown) is deposited and patterned on the upper surface of the substrate 26 so that the only exposed portions of the upper surface correspond to the locations at which the ground plane 27, the legs 86, and leads 82a, 82b are to be located. The first photoresist layer is formed of a photodefinable material.

Figure 7:
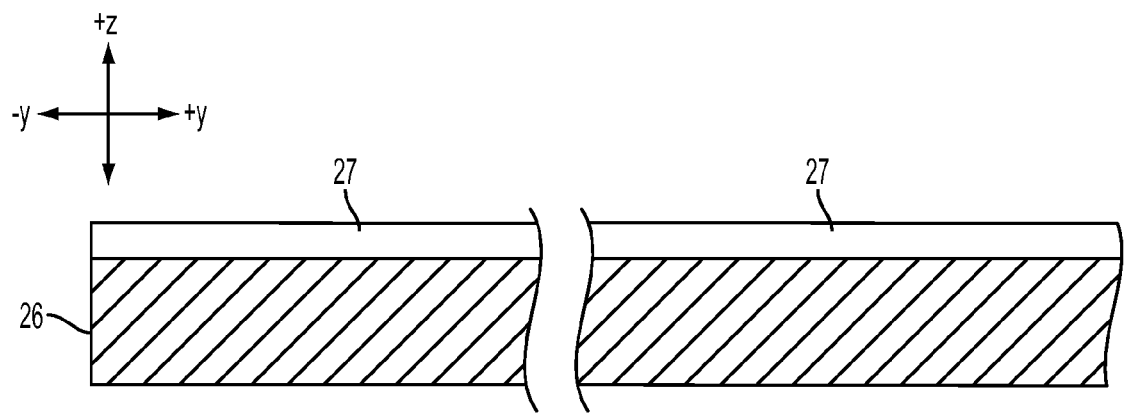
FIG. 7 is a cross-sectional view, taken through the lines "7a-7a" and "7b-7b" of FIG. 3, depicting two different portions of the phase shifter shown in FIGS. 1-6 during a first stage of manufacture.

Electrically-conductive material is subsequently deposited on the exposed portions of the substrate 26 to a predetermined thickness, to form the first layer of the electrically-conductive material as shown in FIG. 7. The deposition of the electrically-conductive material is accomplished using a suitable technique such as chemical vapor deposition (CVD). Other suitable techniques, such as physical vapor deposition (PVD), sputtering, or electroplating, can be used in the alternative. The upper surfaces of the newly-formed first layer can be planarized using a suitable technique such as chemical-mechanical planarization (CMP).

Figure 8:
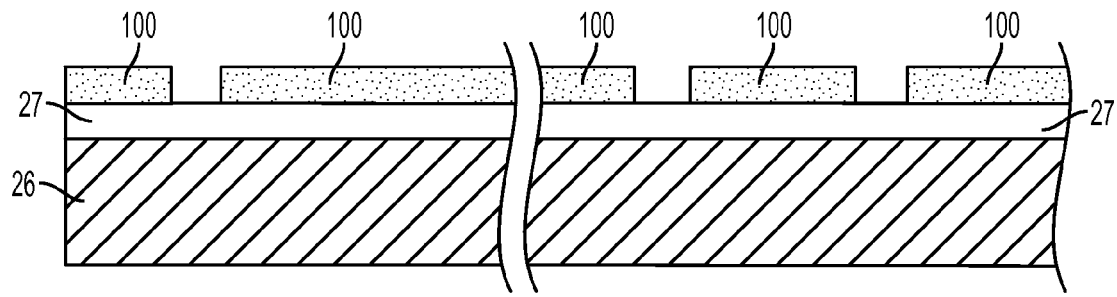
FIG. 8 is a cross-sectional view, taken through the lines "7a-7a" and "7b-7b" of FIG. 3, depicting two different portions of the phase shifter shown in FIGS. 1-6 during a second stage of manufacture.
Figure 9:
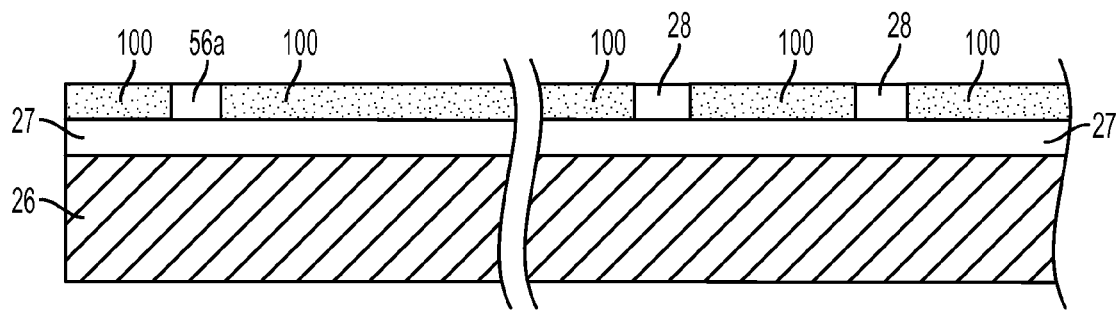
FIG. 9 is a cross-sectional view, taken through the lines "7a-7a" and "7b-7b" of FIG. 3, depicting two different portions of the phase shifter shown in FIGS. 1-6 during a third stage of manufacture.

The second layer of the electrically conductive material forms portions of the sides of the ground housing 28; another portion of each leg 86; another portion of the first and second leads 82a, 82b; and a portion of each of the first and second mounts 56a, 56b. A second photoresist layer 100 is deposited and patterned on the partially-constructed phase shifter 10. As shown in FIG. 8, the second photoresist layer is patterned utilizing a mask so that the only exposed areas on the partially-constructed phase shifter 10 correspond to the locations at which the above-noted portions of the phase shifter 10 are to be located. The electrically-conductive material can subsequently be deposited on the exposed portions of the phase shifter 10 to a predetermined thickness, to form the second layer of the electrically-conductive material as shown in FIG. 9. The upper surfaces of the newly-formed portions of the phase shifter 10 can then be planarized.

Figure 10:
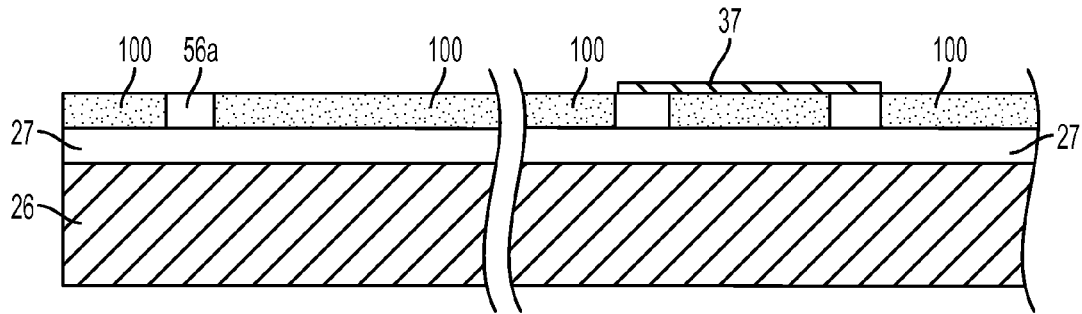
FIG. 10 is a cross-sectional view, taken through the lines "7a-7a" and "7b-7b" of FIG. 3, depicting two different portions of the phase shifter shown in FIGS. 1-6 during a fifth stage of manufacture.

Referring now to FIG. 10, the dielectric material that forms the tabs 37 is deposited and patterned on top of the previously-formed photoresist layer. The dielectric material that forms the dielectric insulator 75 and third portion 53c of the body 52 comprising the shuttle 16 can be deposited and patterned on top of the previously-formed photoresist layer, before or after the tabs 37 are formed.

Figure 11:
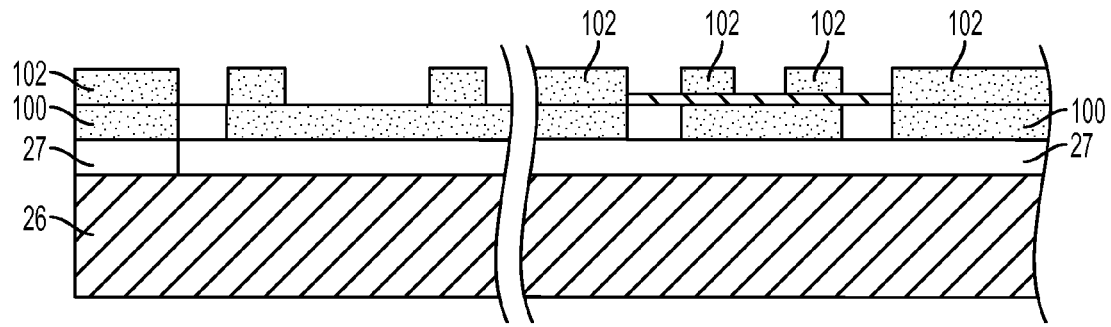
FIG. 11 is a cross-sectional view, taken through the lines "7a-7a" and "7b-7b" of FIG. 3, depicting two different portions of the phase shifter shown in FIGS. 1-6 during a sixth stage of manufacture.
Figure 12:
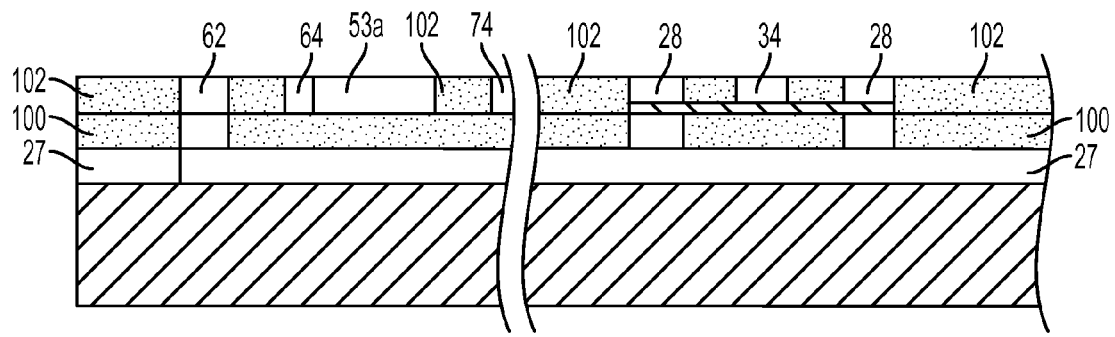
FIG. 12 is a cross-sectional view, taken through the lines "7a-7a" and "7b-7b" of FIG. 3, depicting two different portions of the phase shifter shown in FIGS. 1-6 during a seventh stage of manufacture.
Figure 13:
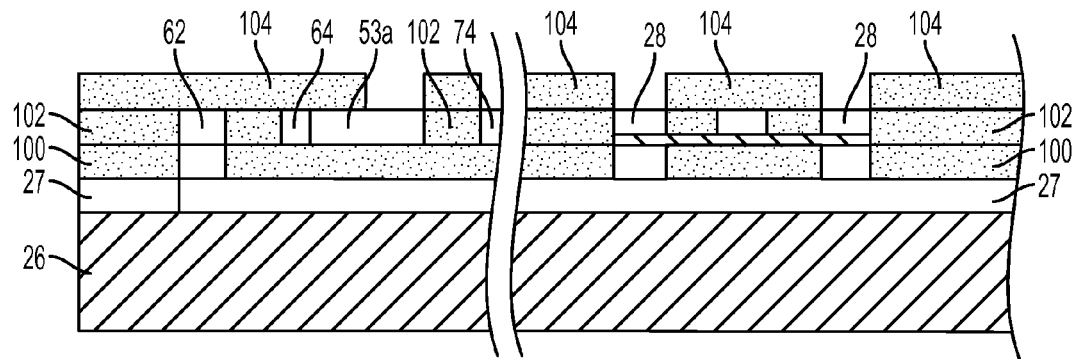
FIG. 13 is a cross-sectional view, taken through the lines "7a-7a" and "7b-7b" of FIG. 3, depicting two different portions of the phase shifter shown in FIGS. 1-6 during an eighth stage of manufacture.
Figure 14:
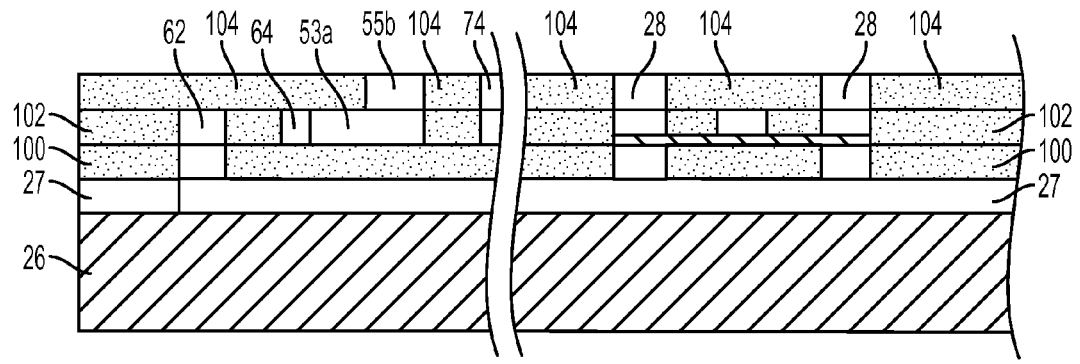
FIG. 14 is a cross-sectional view, taken through the lines "7a-7a" and "7b-7b" of FIG. 3, depicting two different portions of the phase shifter shown in FIGS. 1-6 during a ninth stage of manufacture.
Figure 15:
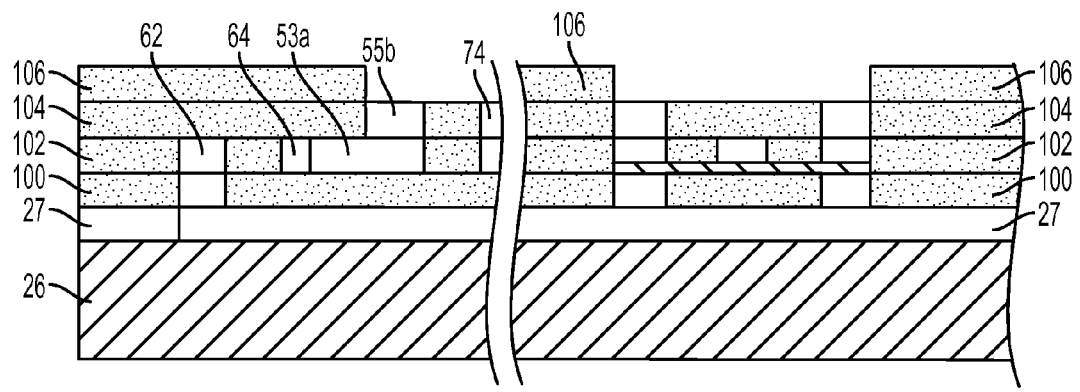
FIG. 15 is a cross-sectional view, taken through the lines "7a-7a" and "7b-7b" of FIG. 3, depicting two different portions of the phase shifter shown in FIGS. 1-6 during a tenth stage of manufacture.
Figure 16:
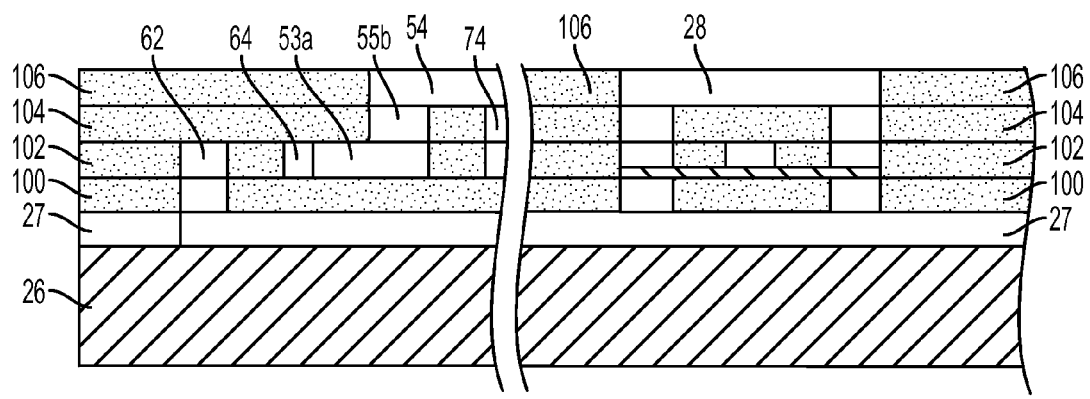
FIG. 16 is a cross-sectional view, taken through the lines "7a-7a" and "7b-7b" of FIG. 3, depicting two different portions of the phase shifter shown in FIGS. 1-6 during an eleventh stage of manufacture.

The third layer of the electrically conductive material forms additional portions of the sides of the ground housing 28; the first and second portions 53a, 53b, and actuator section 53d; additional portions of each of the first and second mounts 56a, 56b including base 62, beam portion 64; and the top portion 88 of the body 80 of the actuator portion 14. The third layer of electrically conductive material also forms portions of the plate 74. As shown in FIG. 11, a third photoresist layer 102 is deposited and patterned on the partially-constructed phase shifter 10. The third photoresist layer is patterned over the second photoresist layer, utilizing a mask so that the only exposed areas on the partially-constructed phase shifter 10 correspond to the locations at which the above-noted components are to be located. Referring now to FIG. 12, the electrically-conductive material can be deposited on the exposed portions of the phase shifter 10 to a predetermined thickness, to form the third layer of the electrically-conductive material. The upper surfaces of the newly-formed portions of the phase shifter 10 can then be planarized.

The fourth layer of electrically conductive material forms bridge risers 55a, 55b and additional portions of the plate 74. The forth layer of the electrically conductive material also forms additional portions of the sides of the ground housing 28. The fifth layer of electrically conductive material forms the bridge portion 54 and the top of the ground housing 28. The fourth and fifth layers are formed in a manner similar to the first, second, and third layers. In particular, the fourth and fifth layers are formed by depositing and patterning additional photoresist material to the previously-formed layers, utilizing a mask or other suitable technique, to form fourth and fifth photoresist layers 104, 106 as shown respectively in FIGS. 13 and 15, and then depositing additional electrically-conductive material to the exposed areas to form the fourth and fifth layers as shown respectively in FIGS. 14 and 16. The upper surfaces of the newly-formed portions of the phase shifter 10 can be planarized after the application of each of the fourth and fifth layers.

Figure 17:
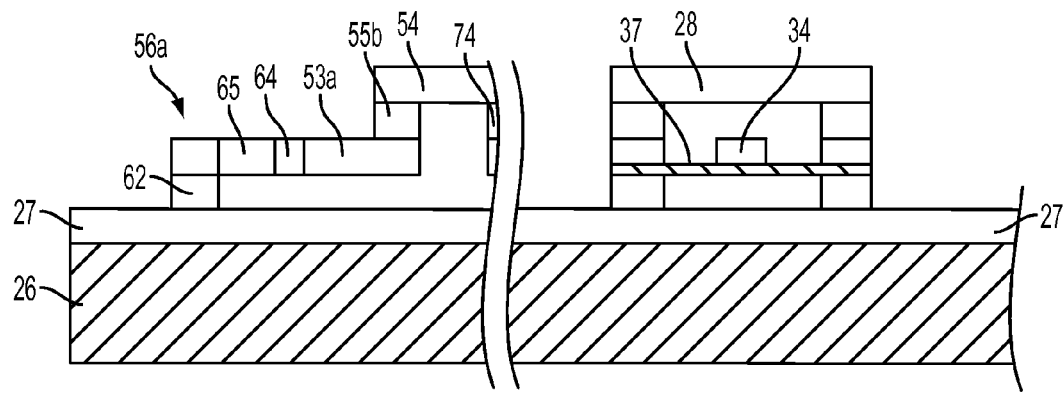
FIG. 17 is a cross-sectional view, taken through the lines "7a-7a" and "7b-7b" of FIG. 3, depicting two different portions of the phase shifter shown in FIGS. 1-6 during a twelve stage of manufacture.

After the fifth layer has been deposited as described herein, the photoresist material remaining from each of the masking steps can be released or otherwise removed as depicted in FIG. 17, using a suitable technique such as exposure to an appropriate solvent that dissolves the photoresist material.

I claim:

1. A phase shifter, comprising:
a housing;
an electrical conductor suspended within the housing on electrically-insulative supports;
a shuttle having a bridge section, a plate attached to said bridge section, and an actuator section, each formed of electrically conductive material, and an insulator portion formed of electrically insulative material which electrically isolates at least said plate from said actuator section; and
an electrically-insulative substrate, and a ground plane disposed on the substrate;
wherein the shuttle is configured for movement between a first position at which the plate is spaced a first distance from the electrical conductor, and a second position at which the plate is spaced a second distance from the electrical conductor;
wherein said plate and said electrical conductor in combination form a capacitor having a capacitance value which is different when said plate is spaced at said first distance as compared to said second distance;
wherein the housing is an electrically-conductive housing in electrical contact with the ground plane; and
wherein the shuttle includes an elongated body spaced a third distance above said substrate, and said bridge section includes a bridge portion and at least one bridge riser, said bridge riser offsetting said bridge portion a fourth distance above said substrate, wherein said third distance is different as compared to said fourth distance.

2. The phase shifter of claim 1, wherein an the electrically conductive path includes said bridge portion and said at least one bridge riser.

3. A phase shifter, comprising:
a housing;
an electrical conductor suspended within the housing on electrically-insulative supports;
a shuttle having a bridge section, a plate attached to said bridge section, and an actuator section, each formed of electrically conductive material, and an insulator portion formed of electrically insulative material which electrically isolates at least said plate from said actuator section;
an electrically-insulative substrate, and a ground plane disposed on the substrate; and
a first and a second mount, wherein first and second mounts are mounted on and are in electrical contact with the ground plane, and the shuttle is suspended from the first and second mounts;
wherein the shuttle is configured for movement between a first position at which the plate is spaced a first distance from the electrical conductor, and a second position at which the plate is spaced a second distance from the electrical conductor;
wherein said plate and said electrical conductor in combination form a capacitor having a capacitance value which is different when said plate is spaced at said first distance as compared to said second distance; and
wherein the housing is an electrically-conductive housing in electrical contact with the ground plane.

4. The phase shifter of claim 3, wherein the first and second mounts each comprise a beam portion configured to resiliently deflect to facilitate movement of the shuttle between the first and second positions.

5. The phase shifter of claim 3, wherein the plate is electrically connected to said first mount through an electrically conductive path which includes at least a portion of said shuttle.

6. The phase shifter of claim 5, wherein the electrically conductive path includes said bridge section and wherein said bridge section traverses said electrical conductor.

7. The phase shifter of claim 3, wherein said actuator section of said shuttle is operative to generate a force when an actuator of said phase shifter is energized, said actuator configured for moving the shuttle from the first position to the second position.

8. The phase shifter of claim 7, wherein the actuator comprises a first and second leg disposed on the substrate, and a top portion mounted on the first and second legs and including a first projection; the actuator section of the shuttle is mechanically coupled to said bridge section and includes a second projection located proximate the first projection; and the first projection, when subjected to a voltage potential, is operative to develop an electrostatic force that attracts the second projection and thereby urges the shuttle toward the second position.

9. The phase shifter of claim 8, wherein the actuator section of the shuttle adjoins the second mount.

10. A phase shifter, comprising:
a housing;
an electrical conductor suspended within the housing on electrically-insulative supports;
a shuttle having a bridge section, a plate attached to said bridge section, and an actuator section, each formed of electrically conductive material, and an insulator portion formed of electrically insulative material which electrically isolates at least said plate from said actuator section; and
a mount structure electrically connected to a ground plane and suspending the shuttle over the ground plane;
wherein the shuttle is moveable between a first position at which the plate is spaced a first distance from the electrical conductor, and a second position at which the plate is spaced a second distance from the electrical conductor; and
wherein said plate and said electrical conductor in combination form a capacitor having a capacitance value which is different when said plate is spaced at said first distance as compared to said second distance.

11. The phase shifter of claim 10, further comprising an electrically-insulative substrate, and a ground plane disposed on the substrate; wherein the housing is an electrically-conductive housing in electrical contact with the ground plane.

12. The phase shifter of claim 10, further comprising a dielectric insulator disposed between said electrical conductor and said plate.

13. The phase shifter of claim 10, wherein:
the housing, the electrical conductor, the plate and the shuttle comprise a plurality of electrically-conductive material layers; and
the plurality of electrically-conductive material layers are stacked on a major surface of a substrate in a direction substantially coincident with a normal to the major surface of the substrate.

14. A process for making a phase shifter, comprising:
selectively depositing a first layer of an electrically-conductive material on a substrate to form at least a portion of a ground plane and an actuator;
selectively depositing a second layer of the electrically-conductive material on the first layer and the substrate to form or further form the actuator, a portion of a housing, and a portion of a mount for a shuttle configured to vary a position of a capacitor plate relative to an electrical conductor on a selective basis when actuated by the actuator; and
selectively depositing a third layer of the electrically-conductive material on the first and second layers and the substrate to form or further form the capacitor plate, the housing, the actuator, the mount, the shuttle, and the electrical conductor.

15. The process of claim 14, further comprising selectively depositing a fourth and a fifth layer of the electrically-conductive material on the first, second, and third layers and the substrate to further form the housing and the shuttle.

16. The process of claim 14, further comprising selectively depositing a dielectric material on the second layer of the substrate to further form the shuttle.

17. The process of claim 14, further comprising selectively depositing a dielectric material on the second layer of the substrate to form a support for the electrical conductor.

18. A phase shifter, comprising
a coaxial transmission line section disposed on a substrate including an exterior housing and an electrical conductor suspended within said housing;
a shuttle suspended on first and second mounts connected to said substrate; and a capacitor plate mechanically coupled to said shuttle and electrically connected to said housing;
wherein said shuttle is configured to transition said capacitor plate from a first position located a first distance from said electrical conductor, to a second position located a second distance from said conductor responsive to an electrical input signal, said first distance is different from said second distance.

19. The phase shifter according to claim 18, further comprising at least one resilient member configured to return said shuttle to said first position in the absence of said electrical signal.

20. The phase shifter according to claim 18, wherein said shuttle, said housing, said capacitor plate and said electrical conductor are comprised of a plurality of layers of electrically conductive material disposed on said substrate.

21. The phase shifter according to claim 18, further comprising an electrostatic actuator configured for generating a force sufficient to move said shuttle from said first position to a second position.

22. The phase shifter according to claim 21, wherein an actuator section of said shuttle is electrically isolated from said plate.

23. The phase shifter according to claim 22, wherein said actuator section forms a part of said electrostatic actuator.

24. The phase shifter according to claim 23, wherein said actuator section of said shuttle comprises an elongated body which includes a plurality of projections which are interdigitated with a plurality of projections disposed on a body of said actuator.

25. The phase shifter according to claim 18, further comprising a dielectric insulator disposed between said capacitor plate and said electrical conductor.

26. The phase shifter according to claim 25, wherein said second distance is equal to a thickness of said dielectric insulator.

* * * * *